(12) United States Patent
Wakako et al.

(10) Patent No.: US 7,648,775 B2
(45) Date of Patent: Jan. 19, 2010

(54) CERAMIC SUBSTRATE, CERAMIC PACKAGE FOR HOUSING LIGHT EMITTING ELEMENT

(75) Inventors: Hisashi Wakako, Komaki (JP); Makoto Nagai, Komaki (JP); Atsushi Uchida, Kagamihara (JP); Masahito Morita, Nagoya (JP); Kazuo Kimura, Komaki (JP)

(73) Assignee: NGK Spark Plug Co., Ltd., Aichi (JP)

( * ) Notice: Subject to any disclaimer, the term of this patent is extended or adjusted under 35 U.S.C. 154(b) by 249 days.

(21) Appl. No.: 11/291,965

(22) Filed: Dec. 2, 2005

(65) Prior Publication Data

US 2006/0147746 A1    Jul. 6, 2006

(30) Foreign Application Priority Data

Dec. 3, 2004  (JP) ............... P. 2004-350927
Feb. 16, 2005 (JP) ............... P. 2005-038775
Mar. 23, 2005 (JP) ............... P. 2005-084449

(51) Int. Cl.
*B32B 15/00* (2006.01)

(52) U.S. Cl. ............. 428/636; 428/596; 428/627; 428/632; 428/620; 428/672; 428/673; 428/680; 428/220; 428/332; 428/336; 428/690; 428/660; 428/663; 428/665; 428/668; 428/674; 428/669; 428/670

(58) Field of Classification Search .......... 428/596, 428/627, 632, 634, 672, 673, 680, 674, 668, 428/669, 670, 660, 665, 663, 216, 687, 220, 428/332, 336; 438/421, 422, 25, 26, 27, 438/28, 29, 30, 69, 72

See application file for complete search history.

(56) References Cited

U.S. PATENT DOCUMENTS

| 5,616,423 A | * | 4/1997 | Sanjyou et al. ............ 428/632 |
| 2002/0163006 A1 | | 11/2002 | Yoganandan et al. |
| 2005/0073846 A1 | | 4/2005 | Takine |
| 2006/0102936 A1 | | 5/2006 | Tomohiro et al. |
| 2008/0043444 A1 | | 2/2008 | Hasegawa et al. |

FOREIGN PATENT DOCUMENTS

| JP | 2000261040 A | | 9/2000 |
| JP | 2002208734 A | | 7/2002 |
| JP | 2002232017 A | | 8/2002 |
| JP | 2003046137 A | | 2/2003 |
| JP | 2003-209286 A | | 7/2003 |
| JP | 2003-347600 A | | 12/2003 |
| JP | 2004-207258 | * | 7/2004 |
| JP | 2004-207672 | | 7/2004 |

(Continued)

OTHER PUBLICATIONS

Japanese Office Action dated Apr. 28, 2009.

(Continued)

*Primary Examiner*—Ling Xu
(74) *Attorney, Agent, or Firm*—Sughrue Mion, PLLC (57) ABSTRACT

A ceramic substrate comprising a metallic layer on its surface, wherein said metallic layer includes: a silver layer containing silver; a gold layer containing gold; and a nickel layer containing nickel, in this order from an outermost layer of said metallic layer.

12 Claims, 3 Drawing Sheets

FOREIGN PATENT DOCUMENTS

| | | |
|---|---|---|
| JP | 2004-228549 A | 8/2004 |
| JP | 2004-241766 A | 8/2004 |
| JP | 2004319939 A | 11/2004 |
| JP | 2005-317596 A | 11/2005 |
| WO | 03/030274 A1 | 4/2003 |
| WO | 2006/028073 A1 | 3/2006 |

OTHER PUBLICATIONS

Japanese Office Action dated May 12, 2009.

* cited by examiner

CERAMIC SUBSTRATE, CERAMIC PACKAGE FOR HOUSING LIGHT EMITTING ELEMENT

FIELD OF THE INVENTION

The present invention relates to a ceramic substrate having a metallic layer on its surface and to a ceramic package for housing a semiconductor element such as a light emitting element.

BACKGROUND OF THE INVENTION

In recent years, ceramics has electric properties such as insulating or dielectric properties so that it is used as a material for electronic parts such as ceramic packages. These electronic parts are configured by housing semiconductor elements (e.g., diodes as light emitting elements, thyristors or transistors) in the ceramic package and by arranging circuits or the like to be connected with the semiconductor elements in the package body. When such circuits are to be arranged, a metallic layer for functioning as a circuit pattern may have to be formed on the surface of the package body by using a conductor such as copper or silver. In order to reflect the light efficiently from the light emitting element, the metallic layer for functioning as the optical reflector may also have to be formed of a conductor (e.g., silver) having excellent reflecting properties on the surface of the package body around the light emitting element.

In case the metallic layer is formed on the surface of the package body, the metallic layer and the ceramics have different coefficients of thermal expansion. When the package is subjected to a temperature change, a strain may occur in the vicinity of the boundary between the ceramics and the metallic layer. In case, moreover, the metallic layer is composed of a plurality of layers of metallic materials of different coefficients of thermal expansion, strains may occur in the vicinity of the boundaries of the individual layers may occur due to the temperature change. In order to avoid this situation, there has been proposed a ceramic package (as referred to JP-A-2004-207258 and JP-A-2004-207672), in which the individual layers (i.e., a metallized layer, a nickel-plated layer and a silver-plated layer) have been prevented in the prior art from being peeling off due to the thermal stress, by forming the metallized layer containing tungsten and molybdenum in ceramics and by adhering a nickel-plated layer and a silver-plated layer (having a thickness of 0.1 to 3 μm) to that metallized layer.

SUMMARY OF THE INVENTION

However, it has been pointed out that the configuration of the prior art thus far described still has room for further improvement in the bonding strength between the nickel-plated layer and the silver-plated layer. In case the cavity is filled with a sealing resin, for example, a local thermal stress is applied, by the expansion or shrinkage of the sealing resin due to the heat, to the surface of the silver-plated layer or the outermost layer of the metallic layer formed on the wall surface of the cavity. It has, therefore, been pointed out that countermeasures are needed against the peeling of the silver-plated layer.

In the configuration of the prior art thus far described, moreover, the silver-plated layer or the surface layer is made as thick as 0.1 to 3 μm to reflect the light of the light emitting element directly. In case the plating thickness is irregular, for example, the underlying nickel-plated layer or the metallized layer may be exposed to the inner face of the cavity. As a result, there is a problem that the light cannot be efficiently reflected from the light emitting element mounted.

Considering the problems thus far described, therefore, the present invention has an object to provide a ceramic substrate and a ceramic package for housing light emitting element, which can prevent the peeling of the outermost layer of the metal layer formed on the surface of the ceramic substrate body thereby to improve the reflecting efficiency reliably in case the light emitting element is mounted. With this object, the invention adopts the following configurations.

According to an embodiment of the invention, there is provided a ceramic substrate comprising a metallic layer on its surface, wherein the metallic layer includes a silver layer containing silver, a layer containing a metal being other than silver and being nobler than nickel, and a nickel layer containing nickel provided in the recited order from the outermost layer.

According to an embodiment of the invention, there is provided a ceramic substrate comprising a metallic layer on its surface, wherein the metallic layer includes a silver layer containing silver, a gold layer containing gold, and a nickel layer containing nickel provided in the recited order from the outermost layer.

In the invention, the ceramic substrate comprises a metallic layer on its surface, and the metallic layer includes a multiplicity of different metal layers containing metallic materials of different kinds, the metallic layer including a silver layer containing silver, a gold layer containing gold which is a metal other than silver and nobler than nickel, and a nickel layer containing nickel provided in the recited order from the outermost layer. Thus, the gold layer is interposed between the nickel layer and the silver layer so that both the bonding strength between the nickel layer and the gold layer and the bonding strength between the gold layer and the silver layer are made higher than the bonding strength between the nickel layer and the silver layer. As a result, it is possible to prevent the pealing between the individual layers (e.g., the gold layer and the outermost silver layer) arranged on the nickel layer, more reliably, as might otherwise be caused a thermal stress or the like. This improvement in the bonding strength is expected to come from that the anchoring effect got by the immigration of silver atoms into the gold-plated layer in the interface between the gold layer and the silver layer and the anchoring effect got by the immigration of the gold atoms into the nickel layer in the interface between the nickel layer and the gold layer are more effective than the anchoring effect got in the layer configuration of the prior art by the immigration of the silver atoms into the nickel layer in the interface between the nickel layer and the silver layer. The nickel layer contains nickel as a main component and may be a layer containing a nickel alloy containing a metal other than nickel. The gold layer contains gold as a main component and may be a layer containing a gold alloy containing a metal other than gold. The silver layer contains silver as a main component (e.g., 50 weight % or more) and may be a layer containing a silver alloy containing a metal other than silver.

The metal other than silver and nobler than nickel is a metal having a larger standard electrode potential than the standard electrode potential of nickel and is exemplified by an element of platinum group such as Ru, Rh, Pd, Os, Ir, Pt, or Cu or Au.

It is preferred for forming a homogeneous layer conveniently that the individual metallic layers composing the multiple metallic layers of different metals by the plating method.

In case the ceramic substrate is equipped with the cavity for housing the semiconductor element, it is possible to adopt the configuration, in which the metallic layers are formed at least on the wall face of the cavity. In this case, a semiconductor element to be housed in the cavity may be a light emitting element. Then, the light from the light emitting element is efficiently reflected by the silver layer or the outermost layer.

According to an embodiment of the invention, there is provided a ceramic substrate for housing a semiconductor element, comprising: a substrate body made from ceramics; a cavity formed in the substrate body; and a metallic layer to be formed on the inner face of the cavity, wherein the metallic layer includes a silver layer containing silver, a gold layer containing gold, and a nickel layer containing nickel provided in the recited order from the outermost layer.

The ceramic substrate of the invention comprises the metallic layer on the inner face of the cavity, and the metallic layer has a multi-layered configuration containing metallic materials of different kinds, the metallic layer including the silver layer containing silver, the gold layer containing gold and the nickel layer containing nickel provided in the recited order from the outermost layer. By thus interposing the gold layer between the nickel layer and the silver layer, both the bonding strength between the nickel layer and the gold layer and the bonding strength between the gold layer and the silver layer are higher than the bonding strength of the prior art between the nickel layer and the silver layer. It is, therefore, possible to prevent the silver layer formed on the periphery of the semiconductor element and the metallic layer made from another metal formed on that silver layer from peeling off due to the thermal stress or the like. Moreover, the nickel layer contains nickel as a main component and may be a layer containing a nickel alloy containing a metal other than nickel. The gold layer contains gold as a main component and may be a layer containing a gold alloy containing a metal other than gold. The silver layer contains silver as a main component and may be a layer containing a silver alloy containing a metal other than silver. The cavity inner face in the invention contains both the wall face and the bottom face of the cavity.

In case the metallic layer is to be formed on the ceramic surface, the metallized layer of tungsten or molybdenum can be formed on the ceramic surface, and the nickel layer, the gold layer and the silver layer can be provided on the metallized layer in the recited order from the side of the metallized layer. Thus, the adhesion to the metallized layer and the nickel layer can be retained not only to improve the adhesion of the outermost silver layer but also to enhance the adhesion as the metallic layer.

Here, the gold layer interposed in the boundary between the nickel layer and the silver layer is made thinner than the nickel layer and the silver layer. For example, as a preferable embodiment, those individual layers can be formed such that the nickel layer has a thickness of 0.5 to 20 µm, such that the gold layer has a thickness of 0.03 to 0.20 µm, and such that the silver layer has a thickness of more than 3 µm and no more than 20 µm.

When the thickness of the silver layer becomes less than 3 µm, such a portion as is not plated with silver due to the plating irregularity may be formed, for example. When the thickness of the silver layer exceeds 20 µm, on the other hand, the cost rises. Therefore, those ranges are determined. The thickness of the silver layer is more preferably more than 3 µm and no more than 15 µm, still more preferably more than 3 µm and no more than 10 µm, still further more preferably 4 to 10 µm, and particularly preferably 6 to 10 µm.

According to these determinations, the silver layer contained in the light reflecting layer formed on the side face of the cavity has a thickness of more than 3 µm and no more than 20 µm. Even if the silver layer is formed by the plating method, the plating irregularity can be reduced, and the silver layer can be formed with a relatively uniform thickness on the side face of the cavity. As a result, the light to be emitted from the light emitting element later mounted on the bottom face of the cavity can be efficiently reflected and emitted to the outside.

Since the upper and lower end portions of the silver-plated layer are liable to become thinner, the lower limit of the thickness is made to satisfy at least the vicinities of the upper and lower ends of the silver-plated layer.

Here, a nickel-plated layer is made to have a thickness within the above-specified range. This is because the thickness of the nickel-plated layer less than 0.5 µm may form such a portion as is not plated with nickel due to the plating irregularity, for example. If the nickel-plated layer has a thickness over 20 µm, on the other hand, the cost may rise, the peeling off at the interface may be caused due to the residual stress of the nickel plate, and the surface may be so rough as to lower the smoothness of the metallic layer surface (or the optical reflecting face) and accordingly the reflection efficiency of the light may be lowered. The desired thickness of the nickel-plated layer 32 is desirably within a range from 1.0 to 15.0 µm and more desirably within a range from 3.0 to 11.0 µm. If the nickel-plated layer is subjected to a heat treatment at a temperature within a range from 700 to 950° C., the adhesion to the metallized layer is more intensified. If the thickness of the nickel-plated layer is within the above-specified range, the nickel-plated layer may also be formed to have multiple layers of nickel by the nickel plating method.

A gold-plated layer is formed to have a thickness of the above-specified range. If this thickness is less than 0.03 µm, the thickness of the gold-plated layer is too thin to expect the improvement in the bonding strength, as expected. If the thickness is more than 0.20 µm, there arise drawbacks that the cost rises, and that the surface of the gold-plated layer becomes so smooth that the anchoring effect or one cause for improving the bonding strength to a silver-plated layer 34 cannot be expected to fail to improve the bonding strength. The thickness of the gold-plated layer is desired to fall within a range from 0.03 to 0.10 µm.

The ceramic substrate (i.e., the ceramic package for housing light emitting element) of the invention contains a ceramic substrate (i.e., the ceramic package for housing light emitting element), in which the surface of the silver layer has a glossiness of 0.2 or more, as a preferable embodiment.

According to this, most of the light irradiated at a predetermined angle on the surface of the silver layer of that glossiness is regularly reflected so that the light emitted from the light emitting element to be later mounted on the bottom face of the cavity can be reflected more efficiently and reliably.

If the glossiness of the surface of the silver layer is less than 0.2, the ratio of the regular reflection of the light irradiated becomes lower. Thus, that range is excluded. The glossiness of the surface of that silver layer is more preferably within a range from 0.4 to 1.9 and still more preferably within a range from 0.9 to 1.9. This glossiness indicates that it is the higher as its GAM value is the closer to 2, and that it is the lower as its GAM value is the closer to 0.

Moreover, the ceramic substrate (i.e., the ceramic package for housing light emitting element) of the invention contains a ceramic substrate (i.e., the ceramic package for housing light emitting element), in which the surface roughness of the silver layer is 3 µm or less in terms of Ra (center-line average surface roughness), as a preferable embodiment.

According to this, most of the light irradiated at a predetermined angle on the silver layer of that surface roughness is regularly reflected on the smooth surface of that silver layer so that the light emitted from the light emitting element to be later mounted on the bottom face of the cavity can be reflected more efficiently and reliably.

If the surface roughness (Ra) of the silver layer exceeds 3 μm, a considerable quantity of the irradiated light is irregularly reflected. Therefore, that range is excluded. The surface roughness (Ra) of the silver layer is more preferably within a range of 1.5 μm or less and still more preferably within a range of 1 μm or less.

Here, the surface roughness (Ra) conforms to the definition of JIS-B0601 (1994).

Here, the ceramic substrate for forming the substrate body and the ceramic package for housing light emitting element are made from ceramics composed mainly of alumina, or glass-ceramics as a low-temperature sintered ceramics. Moreover, the cavity may be either: a substantially circular cone, a substantially oval cone or a substantially elliptic cone having a side face sloped from the periphery of the circular, oval or elliptic bottom and extended toward the surface of the substrate body; or a circular column, an oval column or an elliptic column having the shape of a circular cylinder, an oval cylinder or an elliptic cylinder. Moreover, the light emitting element may contain not only a light emitting diode but also a semiconductor laser. In addition, the silver layer may also be formed not only by the plating method but also by the evaporation or sputtering.

DESCRIPTION OF REFERENCE NUMERALS AND SIGNS 10, 10A, 10B - - - CERAMIC PACKAGE FOR HOUSING LIGHT EMITTING ELEMENT (CERAMIC SUBSTRATE)
12 - - - LIGHT EMITTING ELEMENT
13 - - - SOLDERING MATERIAL
14 - - - CONDUCTIVE ELECTRODE LAYER
15 - - - VIA ELECTRODES
16 - - - BACK ELECTRODE LAYER
20 - - - SUBSTRATE BODY
22 - - - CAVITY
22a - - - WALL FACE
22b - - - BOTTOM FACE
30 - - - METALLIC LAYER
31 - - - METALLIZED LAYER OF W/Mo
32 - - - NICKEL-PLATED LAYER
33 - - - GOLD-PLATED LAYER
34 - - - SILVER-PLATED LAYER
40 - - - CONDUCTIVE ELECTRODE LAYER
51 - - - FIRST NICKEL-PLATED LAYER
52 - - - FILLET PORTION OF SILVER SOLDER
S1 TO S7 - - - CERAMIC LAYER
222 - - - LIGHT RECEIVER
220 - - - PROJECTOR

DETAILED DESCRIPTION OF THE INVENTION

Figure 1:
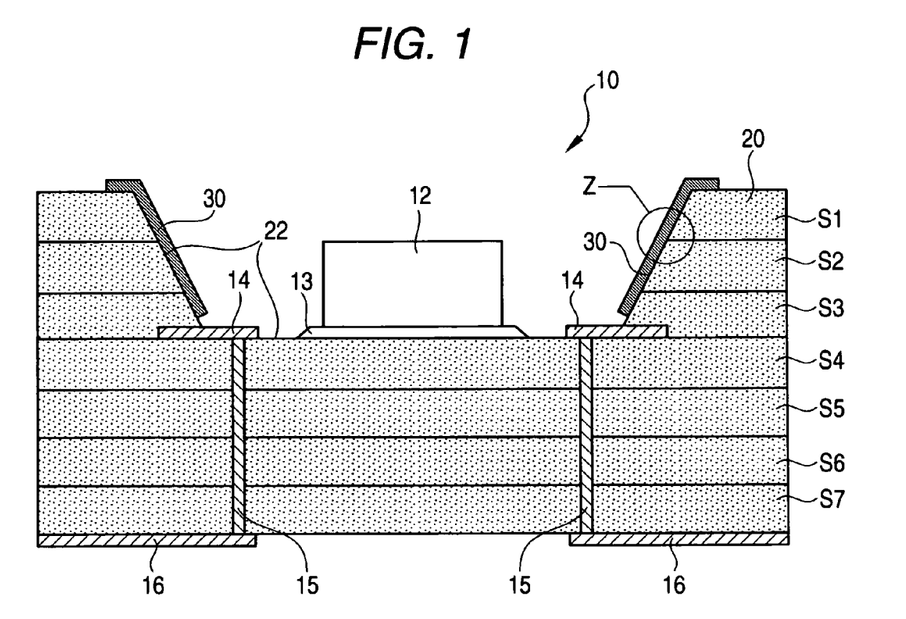
FIG. 1 is an explanatory view presenting a section of the essential portion of a ceramic package 10 for housing light emitting element according to an embodiment of the ceramic substrate of the invention.
Figure 2:
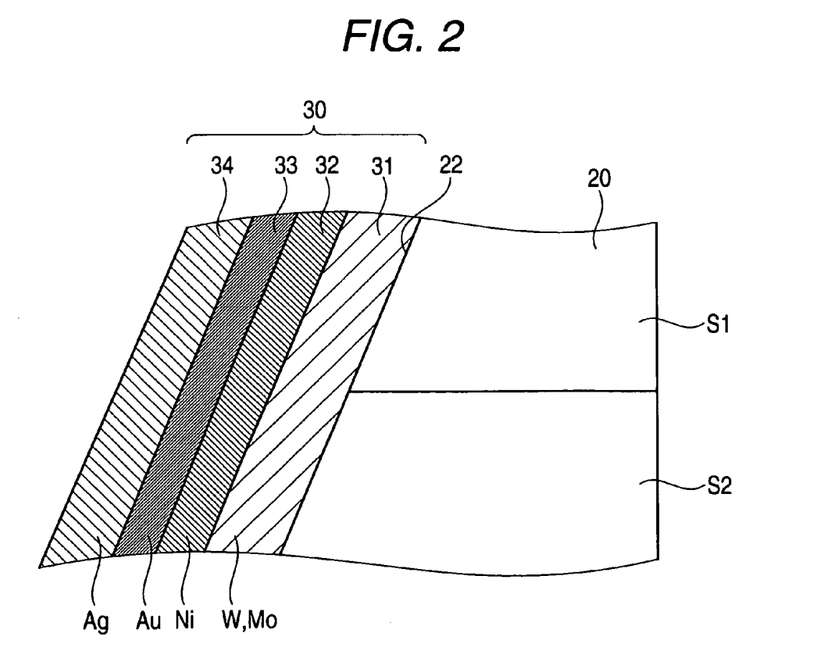
FIG. 2 is an explanatory view schematically showing a Z-portion in FIG. 1 in an enlarged scale.

In order to clarify the configuration and actions of the invention thus far described, here is described an embodiment of the invention. FIG. 1 is an explanatory view presenting a section of the essential portion of a ceramic package 10 for housing light emitting element according to an embodiment of the ceramic substrate of the invention. FIG. 2 is an explanatory view schematically showing a Z-portion in FIG. 1 in an enlarged scale.

As shown, the ceramic package 10 for housing light emitting element is equipped with a substrate body 20 configured by laminating ceramic layers, a cavity 22 opened in the surface of the substrate body 20, and a metallic layer 30 formed continuously along the surface of the substrate body 20. A conductive electrode layer 14 is formed on the bottom face of the cavity 22 formed in that substrate. A light emitting element 12 is housed in that cavity. The substrate body 20 is formed by laminating ceramic layers S1 to S7, which are mainly composed of alumina, aluminum nitride or low-temperature sintered ceramic. In the substrate body 20, the not-shown wiring layers or internal electrodes are formed in desired patterns, and via electrodes 15 are disposed between and through those ceramic layers. The substrate body 20 had sizes of about 5 mm×5 mm×0.9 mm.

The cavity 22 has a circular shape in the top plan view and mounts therein the light emitting element 12 such as a light emitting diode having a square shape in the top plan view through an adhesive such as a soldering material 13 or an epoxy resin, and is made conductive with the conductive electrode layer 14 on the bottom face of the cavity 22 through the not-shown wires. Here, the cavity 22 was sized to have an internal diameter of about 3.6 mm and a depth of about 0.45 mm. The soldering material 13 used is made from an Au—Sn alloy of a low melting point, for example.

The ceramic package 10 for housing light emitting element (or the ceramic substrate) is equipped on its back with a back electrode layer 16. This back electrode layer 16 is connected with the via electrodes 15.

The cavity 22 for housing the light emitting element 12 has a wall face sloped at 30 to 80 degrees with respect to its bottom face, and is provided with the metallic layer 30 on the slope face, as shown in FIG. 2. This metallic layer 30 is formed, from the surface side of the slope face of the cavity 22 (from the side of the ceramic body), to have a metallized layer 31 of tungsten or molybdenum, a nickel (or nickel-plated) layer 32 of nickel, a gold (or gold-plated) layer 33 of gold, and a silver (or silver-plated) layer 34 of silver at the outermost layer. The gold-plated layer 33 has a thickness smaller than those of the nickel-plated layer 32 or the silver-plated layer 34 such that: the nickel-plated layer 32 had a thickness of 6 to 10 μm; the gold-plated layer 33 had a thickness of 0.05 to 0.10 μm; and the silver-plated layer 34 had a thickness of 6 to 10 μm.

The silver-plated layer 34 had a surface roughness (Ra) within a range of 1.5 μm or less. Moreover, the silver-plated layer 34 had a surface glossiness (or a GAM value) within a range from 0.4 to 1.9.

Here, the glossiness (or the GAM value) was calculated by Formula 1:

$$\text{Glossiness} = 2 - \log(B/A). \quad \text{Formula 1}$$

Figure 6:
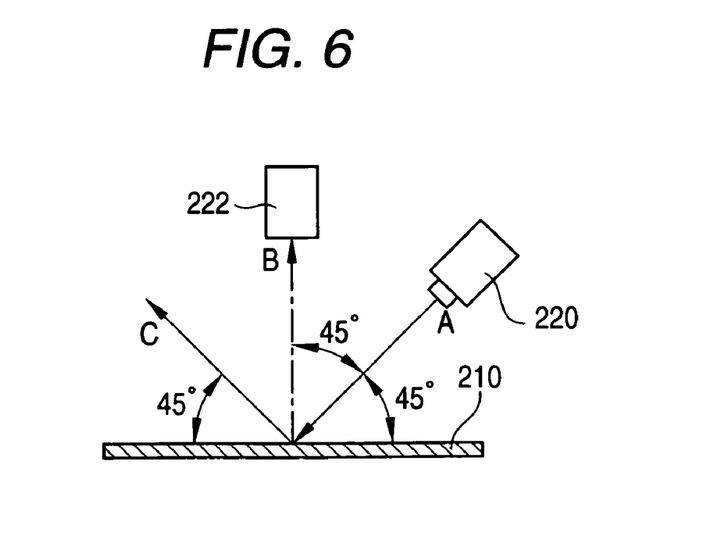
FIG. 6 is a schematic diagram showing a method for measuring a glossiness.

The glossiness (or the GAM value) was measured by a method shown in FIG. 6.

A light reflecting layer 210 including the silver-plated layer was so fixed in advance on the not-shown level block that the silver-plated layer was directed upward, as shown. A projector 220 was arranged at a position of 45 degrees over the level block, and a light receiver 222 was arranged in the perpendicular direction.

Next, a light A was projected at an angle of incidence of 45 degrees to the light reflecting layer 210 from the projector 220.

This light A is normally reflected on the silver-plated layer positioned as the surface layer of the light reflecting layer 210 so that most of it becomes a light C of an angle of reflection of 45 degrees. However, a partial light B is irregularly reflected into an irregular light B by the undulations or surface roughness on the surface of the silver-plated layer so that it is received by the light receiver 222. The quantity of this light B was measured by the light receiver 222 or the like.

As the light B becomes the less, as expressed by Formula 1, the glossiness comes the closer to 2. As the light B becomes the more, the glossiness comes the closer to 0.

The silver-plated layer having the glossiness within a range of 0.2 or more had a smooth surface and a uniform thickness within the thickness and surface roughness (Ra) ranges. In case, therefore, the light reflecting layer 210 including the silver-plated layer having the ranges of the thickness (more than 3 μm and no more than 20 μm), the glossiness (0.2 or more) and the surface roughness (Ra) (3 μm or less) was formed on the side face (or the wall face) of the cavity 22, the light emitted from the light emitting element 12 was efficiently and reliably reflected to the outside.

According to the ceramic package 10 for housing light emitting element thus far described, therefore, the light of the light emitting element 12 mounted in the cavity 22 could be efficiently and reliably reflected.

Here is described the process for manufacturing the ceramic package 10 for housing light emitting element thus configured according to one embodiment of the ceramic substrate. Of the alumina green sheet to form the ceramic layers S1 to S7 after sintered, the green sheet for the ceramic layers S1 to S3 was punched in advance to form tapered through holes contoured to the slope face shape of the wall face of the cavity 22. And, the green sheet for the ceramic layers S4 to S7 after sintered was punched to form the through holes for the via electrodes 15.

A conductive paste containing metal powders of tungsten (W) or molybdenum (Mo) was applied to or printed on the green sheet at predetermined positions. Specifically, the green sheet for the ceramic layers S1 to S3 was coated or printed on the surface of its slope face with the conductive paste in the electrode pattern of the metallized layer 31, and the green sheet for the ceramic layers S4 to S7 was printed with the conductive paste for the conductive electrode layer 14 and the back electrode layer 16. Here, the metallized layer 31 and the conductive electrode layer 14 were electrically insulated from each other. In case the ceramic layers S4 to S7 contained wiring layers or internal electrodes, the green sheet was printed with the desired electrode pattern.

For the via electrodes 15, the through holes were filled with the conducive paste simultaneously as the green sheets were printed with the electrode patterns in the states of the individual ceramic layers. Here, the through holes may also be filled with the conductive paste after the green sheets had been laminated.

These green sheets were sequentially laminated and sintered to form the ceramic layer laminate, in which the cavity 22 had its wall face enclosed with the slope face sloped with respect to the bottom face. Here, the ceramic layers are made from alumina but may also be made from an aluminum nitride or a low-temperature sintered ceramic such as glass ceramic.

In the ceramic layer laminate, at least the metallized layer 31 formed on the wall face of the cavity 22 was so electrically plated with the individual metal layers (or the individual plated metals) of the nickel (or nickel-plated) layer 32, the gold (or gold-plated) layer 33 and the silver (or silver-plated) layer 34 sequentially in the recited order as to have the aforementioned thicknesses thereby to form the metallic layer 30.

Especially at the time of forming the gold-plated layer, the strike plating method was adopted to perform the oxide removal/activation of the material surface simultaneously as the plating operation. The conductive electrode layer 14 and the back electrode layer 16 were also formed by a method like that for forming the metallic layer 30. The nickel layer 32, the gold layer 33 and the silver layer 34 may also be formed with the individual metals by a suitable method such as the electrolytic plating method, the electrolessly plating method, the evaporation or the sputtering. These individual layers 32, 33 and 34 were also electrically insulated from the conductive electrode layer 14 as in the case of the metallized layer 31.

By the manufacturing method thus far described, the ceramic package 10 for housing light emitting element (or the ceramic substrate) was obtained. The light emitting element 12 was fixed on the substrate body 20 of the ceramic package 10 for housing light emitting element (or the ceramic substrate) thus prepared by the manufacturing method, through the soldering material 13. The light emitting element and the conductive electrode layer 14 were connected through the not-shown wires, and a transparent thermosetting resin (e.g., an epoxy resin) was injected into the cavity 22.

In the ceramic package 10 for housing light emitting element of this embodiment, as has been described hereinbefore, the multi-layered metallic layer 30 was formed on the peripheral slope face for the wall face of the cavity 22, as shown in FIG. 2, and the gold-plated layer 33 was interposed between the silver-plated layer 34 or the outermost layer of that metallic layer and the nickel-plated layer 32 on the side of the metallized layer 31 of W or Mo. Moreover, the plated layers were formed by the strike plating method capable of removing/activating the oxides of the material surface. As a result, the adhesion between the gold-plated layer 33 and the outermost silver-plated layer 34 and the adhesion between the gold-plated layer 33 and the nickel-plated layer 32 were enhanced so that the bonding strength of the outermost silver-plated layer 34 could be enhanced. This improvement in the bonding strength is expected to come from that the anchoring effect got by the immigration of silver atoms into the gold-plated layer 33 in the interface between the outermost silver-plated layer 34 and the gold-plated layer 33 and the anchoring effect got by the immigration of the gold atoms into the nickel-plated layer 32 in the interface between the gold-plated layer 33 and the nickel-plated layer 32 are more effective than the anchoring effect got according to the prior art by the immigration of the silver atoms into the nickel-plated layer in the plated layer of the case, in which the silver-plated layer is directly formed in the nickel-plated layer.

Here is described the contrast of the ceramic package 10 for housing light emitting element of this embodiment to the article of the prior art. This conventional ceramic package is different from the ceramic package 10 for housing light emitting element of the embodiment in that the metallic layer 30 is a metallic layer having no gold-plated layer 33 (that is, the metallic layer having the silver-plated layer laminated on the nickel-plated layer). In the remaining points, the ceramic package has a configuration similar to that of the present embodiment and is manufactured by a similar manufacturing method. In this conventional article, the conductive electrode layer was wire-bonded to cause a drawback that the silver-plated layer peeled off the nickel-plated layer so that the nickel-plated layer was exposed to the outside. In the ceramic package 10 for housing light emitting element of this embodiment, however, the peeling of the silver-plated layer 34 was not found to cause no drawback. From this, it is estimated that the anchoring effect and the according improvement in the bonding strength was attained by interposing the gold-plated layer 33 between the nickel-plated layer 32 and the silver-plated layer 34.

Moreover, the metallic layer 30 was diced to test whether or not the physical layer peeling occurred. In the conventional article having the metallic layer without the gold-plated layer, the peeling of the silver-plated layer and the exposure of the nickel-plated layer were found. However, these drawbacks were not found in the ceramic package 10 for housing light emitting element of the embodiment. This effect is also estimated to come from the anchoring effect coming from the gold-plated layer 33 interposed between the nickel-plated layer 32 and the silver-plated layer 34 and from the according improvement in the bonding strength.

Figure 3:
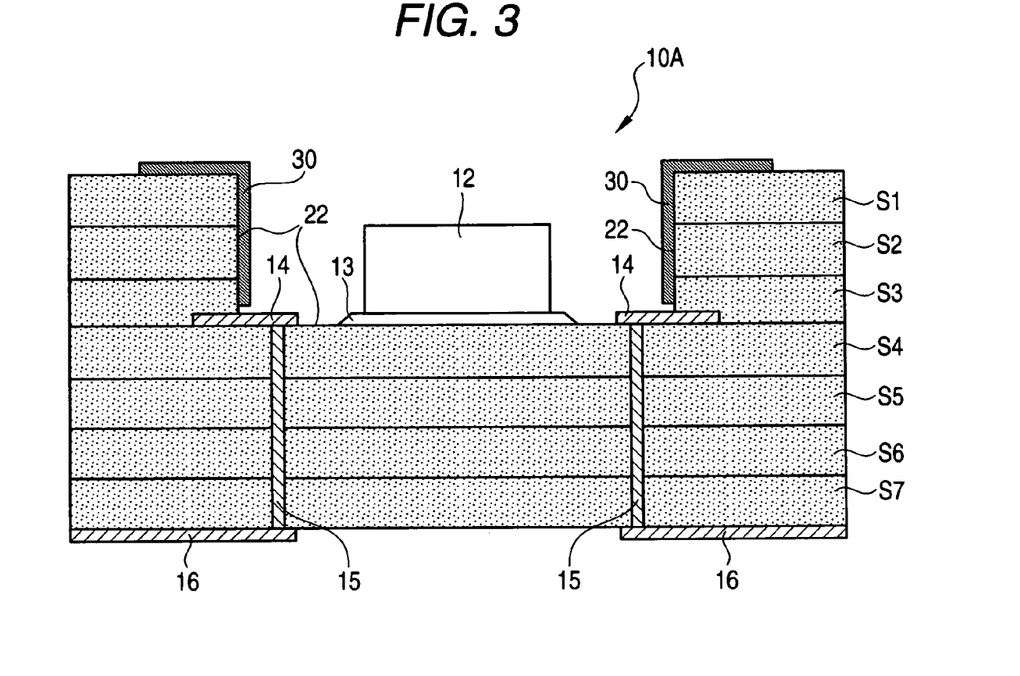
FIG. 3 is an explanatory view presenting a section of the essential portion of a ceramic package 10A for housing light emitting element according to a modification of the ceramic substrate of the invention.

Here is described a modification. FIG. 3 is an explanatory view presenting a section of the essential portion of a ceramic package 10 for housing light emitting element A according to the modification of the invention. As shown in FIG. 3, the ceramic package 10A is different from that of the foregoing embodiment only in that the cavity 22 has a wall face substantially perpendicular to the bottom face of the cavity 22. The configuration of the metallic layer 30 on the wall face of the cavity 22 is similar to that of the ceramic package 10 for housing light emitting element of the foregoing embodiment. In the ceramic package 10 for housing light emitting element A having that cavity shape, therefore, it was possible to enhance the bonding strength of the outermost silver-plated layer 34.

By the ceramic package 10 for housing light emitting element A thus far described, too, it is possible to exhibit actions and effects similar to those of the ceramic package 10 for housing light emitting element.

Figure 4:
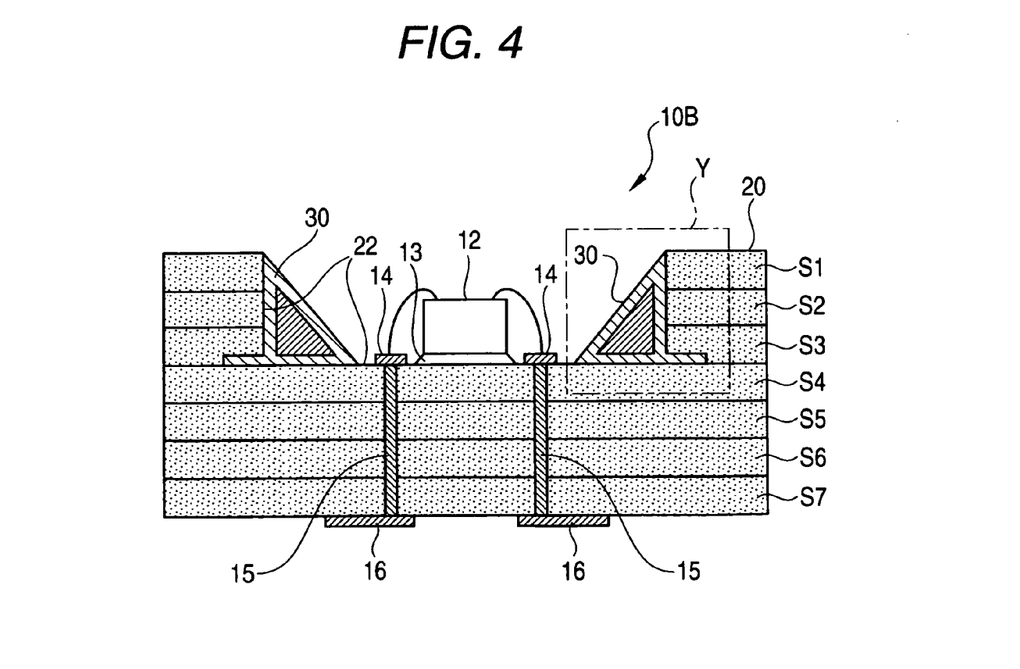
FIG. 4 is an explanatory view presenting a section of the essential portion of a ceramic package 10B for housing light emitting element according to another modification of the ceramic substrate of the invention.
Figure 5:
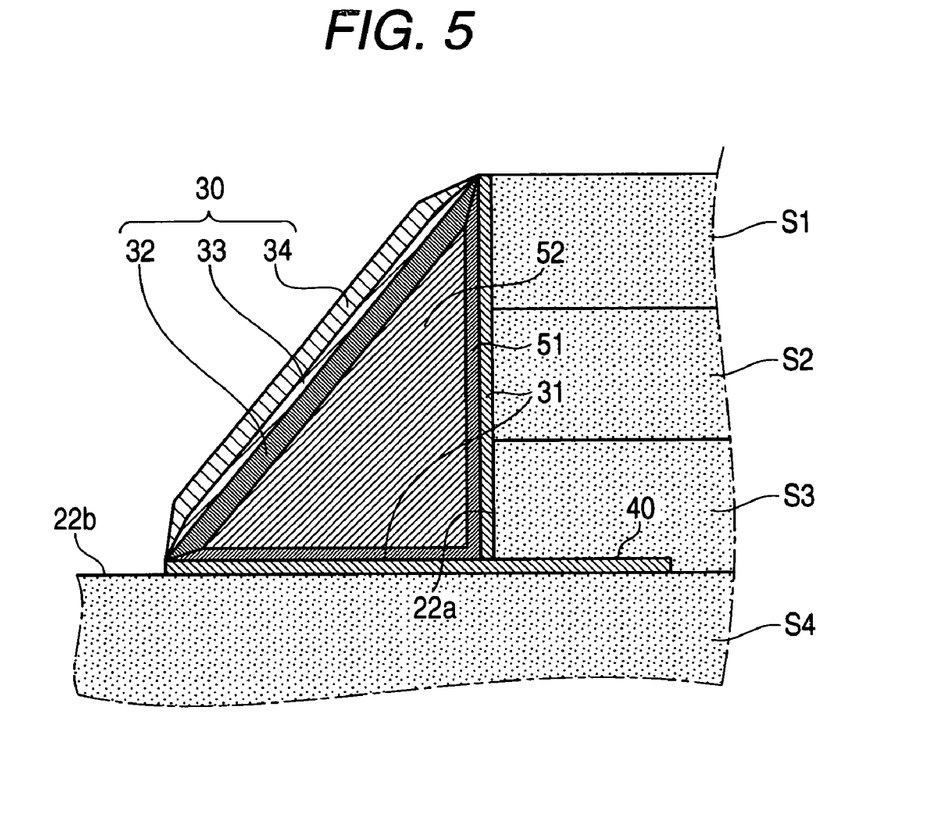
FIG. 5 is an explanatory view showing a portion, as indicated at Y by single-dotted lines in FIG. 4, in an enlarged scale.

Here is described another modification. FIG. 4 is an explanatory view presenting a section of the essential portion of a ceramic package 10 for housing light emitting element B according to another modification of the invention. FIG. 5 is an explanatory view showing a portion, as indicated at Y by single-dotted lines in FIG. 4, in an enlarged scale.

This ceramic package 10 for housing light emitting element B is common to those of the foregoing embodiment and modification, as shown in FIG. 4, in that it is equipped with the laminated configuration of the ceramic layers S1 to S7 like that of the ceramic package 10 for housing light emitting element A of the foregoing modification, and in that the light emitting element 12 is disposed on the bottom face of the cavity 22 in the substrate body 20. Thus, the following description is made on the different configurations.

The ceramic package 10 for housing light emitting element B of this modification is characterized in that the metallic layer 30 to function as a light reflecting face has a slope face although the wall face of the cavity 22 is substantially perpendicular to the bottom face of the cavity 22 as in the ceramic package 10 for housing light emitting element A. As specifically shown in FIG. 5, the metallic layer 30 presents a ring shape in a top plan view and is sloped from the upper end of the wall face 22a of the cavity 22 to the bottom face 22b of the cavity 22.

Over the wall face 22a and the bottom face 22b of the cavity 22, there is formed of metallized layer 31 of W or Mo, which has a substantial L-shape on those faces. This metallized layer 31 includes a conductive electrode layer 40 extending between the ceramic layer S3 and the ceramic layer S4. Moreover, a first nickel-plated layer 51 was formed in a substantial L-shaped along the surface of the metallized layer 31 by the electrolytic plating method. On the surface of the first nickel-plated layer 51, moreover, there was formed a fillet portion 52 of a silver solder having a section of a right angled triangle. This fillet portion 52 was formed by arranging a solid silver solder at the corner portion of the first nickel-plated layer 51 and by heating the silver solder to a desired temperature to melt the silver solder.

On the slope face of the fillet portion 52, moreover, the nickel-plated layer 32, the gold-plated layer 33 and the silver-plated layer 34 were formed in the recited order from the side of the fillet portion 52 by the electrolytic plating method, so that those three plated layers were formed into the metallic layer 30. In this case, the nickel-plated layer 32 was formed over the first nickel-plated layer 51 extending to the outer side on the lower end side and the upper end side of the fillet portion 52. The nickel-plated layer 32 and the first nickel-plated layer 51 are plated-layers of the metal (i.e., nickel) of the same kind so that they are integrated with each other by the so-called excellent "drape" thereby to take in the fillet portion 52. The gold-plated layer 33 and the silver-plated layer 34 to be formed on the nickel-plated layer 32 were sequentially formed to have the aforementioned thicknesses. In this case, the upper/lower end portion of the silver-plated layer 34 is liable to become thinner, so that the aforementioned thickness of more than 3 μm is applied to at least that position.

In the ceramic package 10 for housing light emitting element B thus far described, too, the gold-plated layer 33 was interposed in the metallic layer 30 between the outermost silver-plated layer 34 and the nickel-plated layer 32 so that the bonding strength of the outermost silver-plated layer 34 could be enhanced. In addition, the first nickel-plated layer 51 was formed on the metallized layer 31, and the fillet portion 52 formed on the first nickel-plated layer 51 was made from the silver solder so that their adhesion was high. Moreover, the nickel-plated layer 32 was formed on the fillet portion 52, and this fillet portion 52 was the silver solder so that the nickel-plated layer 32 had a high adhesion to the fillet portion 52. Therefore, the nickel-plated layer 32 of the metallic layer 30 exhibited a high adhesion to the metallized layer 31 through the first nickel-plated layer 51 and the fillet portion 52, although the nickel-plated layer 32 was not formed directly on the metallized layer 31. As a result, the ceramic package 10 for housing light emitting element B of this modification could also exhibit actions and effects like those of the ceramic packages 10 and 10A.

The first nickel-plated layer 51 was formed by the electrolytic plating method to have a thickness of 0.5 to 2 μm. In this case, the first nickel-plated layer 51 did not contain any cobalt (Co) for improving the flowability or wettability of the silver solder to form the fillet portion 52.

Moreover, the first nickel-plated layer 51 was intensified and enhanced in the adhesion to the metallized layer 31 by subjecting it to a heat treatment within a temperature range from 700 to 950° C.

The nickel-plated layer 32 in the metallic layer 30 was formed to have a thickness of 1.5 to 9 μm by the electrolytic plating method. The nickel-plated layer 32 had a smoother surface than that of the first nickel-plated layer 51. As a result, the surface was made so smooth to improve the reflecting efficiency that the adhesion of the gold-plated layer 33 and the silver-plated layer 34 to be electrolytically formed on the nickel-plated layer 32 raised no problem. Moreover, the nickel-plated layer 32 may also be subjected to a heat treatment within a range from 500 to 750° C. The heat treatment was made lower than the temperature range lower than that of the case of the first nickel-plated layer 51. This is because the silver solder may melt to cause drawbacks, unless the temperature range is lower than the melting point of the silver solder to configure the fillet portion 52. Especially if a the nickel-plated layer 32 is formed by a brightening nickel plating method adding a brightener to the plating liquid, the flat face can be more smoothly formed.

Moreover, the nickel-plated layer was formed by dividing it into the first nickel-plated layer 51 and the nickel-plated layer 32 so that the plating methods could be changed for the individual layers or so that the heat treatments could be added to the individual layers. It was, therefore, possible to smoothen the surface of the light reflecting face of the metallic layer 30 and to achieve the formation of the metallic layer 30 having a high adhesion to the metallized layer.

The invention should not be limited to the embodiment and modifications thus far described but could take various modes within a range undeparting from the gist thereof. For example, the foregoing embodiment and modifications have been so described as directed to the ceramic package having the light emitting element 12. However, the invention can also be applied to the ceramic package having another semiconductor device in place of the light emitting element 12 or to a ceramic substrate which is equipped with multiple metal layers on its surface and which has a silver-plated layer at the outermost layer of the metallic layer.

Moreover, the layer to be interposed between the nickel-plated layer and the silver-plated layer may be a metal nobler than nickel and other than silver. For example, the interposed layer may be a layer of either an element of the platinum group, such as Ru, Rh, Pd, Os, Ir or Pt, or Cu.

This application is based on Japanese Patent application JP 2004-350927, filed Dec. 3, 2004, Japanese Patent application JP 2005-38775, filed Feb. 16, 2005, and Japanese Patent application JP 2005-84449, filed Mar. 23, 2005, the entire contents of which are hereby incorporated by reference, the same as if set forth at length.

What is claimed is:

1. A ceramic substrate comprising a metallic layer on its surface, wherein said metallic layer includes, in the following order: a nickel layer containing nickel as a main component; a gold layer containing gold as a main component; a silver layer containing silver as a main component; and a metallized layer containing tungsten or molybdenum, the metallized layer being formed on the ceramic substrate and directly contacting the nickel layer, wherein said silver layer is an outermost layer of said metallic layer, and wherein the gold layer is interposed between and in direct contact with each of the nickel layer and the silver layer so that the bonding strength between the gold layer and the silver layer is made higher than a bonding strength between a nickel layer and a silver layer.

2. The ceramic substrate according to claim 1, wherein said gold layer provided between said nickel layer and said silver layer has a thickness being smaller than that of said nickel layer and being smaller than that of said silver layer.

3. The ceramic substrate according to claim 1, wherein said silver layer has a thickness of more than 3 μm and no more than 20 μm.

4. The ceramic substrate according to claim 1, wherein said nickel layer has a thickness of from more than 1 to 20 μm, said gold layer has a thickness of from 0.03 to 0.20 μm, and said silver layer has a thickness of more than 3 μm and no more than 20 μm.

5. The ceramic substrate according to claim 1, wherein said silver layer has a thickness of more than 3 μm and no more than 10 μm.

6. The ceramic substrate according to claim 1, wherein said silver layer has a surface glossiness of 0.2 or more.

7. The ceramic substrate according to claim 1, wherein said silver layer has a center-line average surface roughness of 3 μm or less.

8. A ceramic substrate for housing a semiconductor element, comprising:
a substrate body;
a cavity formed in said substrate body for housing said semiconductor element; and
a metallic layer on an inner face of said cavity,
wherein said metallic layer includes, in the following order: a nickel layer containing nickel as a main component; a layer containing a metal being other than silver as a main component and being nobler than nickel; and a silver layer containing silver as a main component, wherein said silver layer is an outermost layer of said metallic layer.

9. The ceramic substrate according to claim 8, wherein said metal being other than silver and being nobler than nickel is at least one of Ru, Rh, Pd, Os, Ir, Pt, Cu and Au.

10. The ceramic substrate according to claim 8, wherein said metal being other than silver and being nobler than nickel is Au.

11. A ceramic package comprising:
a substrate body comprising ceramic;
a cavity opened in a surface of said substrate body for mounting a light emitting element on its bottom face; and
a metallic layer provided on a side face of said cavity,
wherein said metallic layer includes, in the following order, a nickel layer containing nickel as a main component; a layer containing a metal other than silver as a main component and being nobler than nickel; and a silver layer containing silver as a main component, wherein said silver layer is an outermost layer of said metallic layer, and
wherein said silver layer has a surface glossiness of 0.2 or more and a thickness of more than 3 μm and no more than 10 μm.

12. The ceramic package according to claim 11, wherein said silver layer has a center-line average surface roughness of 3 μm or less.

* * * * *